US010720105B2

(12) United States Patent
Ishii

(10) Patent No.: US 10,720,105 B2
(45) Date of Patent: Jul. 21, 2020

(54) DISPLAY PANEL CONTROL DEVICE, DISPLAY DEVICE, AND METHOD FOR DRIVING DISPLAY PANEL

(71) Applicant: JOLED INC., Tokyo (JP)

(72) Inventor: Hiroaki Ishii, Tokyo (JP)

(73) Assignee: JOLED INC., Tokyo (JP)

( * ) Notice: Subject to any disclaimer, the term of this patent is extended or adjusted under 35 U.S.C. 154(b) by 84 days.

(21) Appl. No.: 15/991,234

(22) Filed: May 29, 2018

(65) Prior Publication Data

US 2018/0350304 A1 Dec. 6, 2018

(30) Foreign Application Priority Data

Jun. 1, 2017 (JP) ................................ 2017-109175

(51) Int. Cl.
*G09G 3/3258* (2016.01)
*H04N 7/56* (2006.01)
(Continued)

(52) U.S. Cl.
CPC ......... *G09G 3/3258* (2013.01); *G09G 3/2022* (2013.01); *G09G 3/3233* (2013.01);
(Continued)

(58) Field of Classification Search
CPC ... G09G 2300/0842; G09G 2300/0861; G09G 2310/0216; G09G 2310/0264;
(Continued)

(56) References Cited

U.S. PATENT DOCUMENTS 10,425,623 B2 * 9/2019 Ishii ..................... G09G 3/3258
2007/0126757 A1 6/2007 Itoh et al.
(Continued)

FOREIGN PATENT DOCUMENTS

JP 2006-030516 2/2006
KR 10-2006-0123780 12/2006
KR 10-2014-0130630 11/2014

OTHER PUBLICATIONS

Korean Office Action, dated Mar. 12, 2019, for the corresponding Korean Patent Application No. 10-2018-0085259.

*Primary Examiner* — Afroza Chowdhury
(74) *Attorney, Agent, or Firm* — Greenblum & Bernstein, P.L.C.

(57) ABSTRACT

A control device includes a data storing unit, a synchronization control unit, and a duty control unit. The synchronization control unit starts a frame period when a vertical synchronization signal is received. The frame period includes a video image period and an extended period. The synchronization control unit initializes pixel circuits within a predetermined period after the reception of the vertical synchronization signal, temporarily stores the video image signal in the data storing unit after the reception of the vertical synchronization signal, and supplies the video image signal from the data storing unit to a display panel after the initialization and during the video image period. The duty control unit causes the display panel to emit light after the initialization and during the video image period, and controls the display panel such that the display panel emits and extinguishes light at a predetermined duty ratio during the extended period.

12 Claims, 10 Drawing Sheets

Control device
26
16
Source driving circuit
Video image signals R,G,B
Data storing unit
Panel unit
Vertical synchronization signal (VS)
Horizontal synchronization signal (HS)
Video image period signal (DE)
Synchronization control unit
Gate driving circuit
1
28
14
12
Light extinction period (n) count
Light emission period (m) count
Duty control unit
Light extinction signal (EN)
50
20
Display device Frame period (fixed)
Vertical synchronization signal (VS)
Video image period signal (DE)
Source driving signal
Initialization
Gate driving signal
Writing
Light extinction
Writing
Light emission m
Light extinction n

(51) Int. Cl.
*H04N 5/06* (2006.01)
*G09G 3/3233* (2016.01)
*H04N 5/04* (2006.01)
*G09G 3/20* (2006.01)
*H01L 51/52* (2006.01)
*H01L 51/50* (2006.01)

(52) U.S. Cl.
CPC ................. *H04N 5/04* (2013.01); *H04N 5/06* (2013.01); *H04N 7/56* (2013.01); *G09G 2300/0842* (2013.01); *G09G 2300/0861* (2013.01); *G09G 2310/0216* (2013.01); *G09G 2310/0264* (2013.01); *G09G 2320/0247* (2013.01); *G09G 2340/0435* (2013.01); *H01L 51/5072* (2013.01); *H01L 51/5092* (2013.01); *H01L 51/5203* (2013.01)

(58) Field of Classification Search
CPC ... G09G 2320/0247; G09G 2340/0435; G09G 3/2022; G09G 3/3233; G09G 3/3258; H01L 51/5072; H01L 51/5092; H01L 51/5203; H04N 5/04; H04N 5/06; H04N 7/56
See application file for complete search history.

(56) References Cited

U.S. PATENT DOCUMENTS

| | | | | |
|---|---|---|---|---|
| 2013/0127924 | A1* | 5/2013 | Lee .......................... | G09G 3/32 345/690 |
| 2014/0327664 | A1 | 11/2014 | Kanda et al. | |
| 2019/0014292 | A1* | 1/2019 | Ishii ......................... | H04N 7/56 |

* cited by examiner

DISPLAY PANEL CONTROL DEVICE, DISPLAY DEVICE, AND METHOD FOR DRIVING DISPLAY PANEL

CROSS REFERENCE TO RELATED APPLICATIONS

The present application is based on and claims priority of Japanese Patent Application No. 2017-109175 filed on Jun. 1, 2017. The entire disclosure of the above-identified application, including the specification, drawings and claims is incorporated herein by reference in its entirety.

FIELD

The present disclosure relates to a display panel control device, a display device, and a method for driving a display panel.

BACKGROUND

Conventionally, in a computer or a mobile device, a video image is displayed on a display screen by a video image processing device called GPU (Graphics Processing Unit) (see, for example, Patent Literature 1 (PTL 1)).

PTL 1 discloses a display device in which the number of sub-frames that constitute one frame is determined according to a set on-duty ratio. Then, display driving is performed based on the determined number of sub-frames.

Also, in recent years, the video image display rate on a display screen is determined increasingly by the GPU performance.

CITATION LIST

Patent Literature

PTL 1: Japanese Unexamined Patent Application Publication No. 2006-30516

SUMMARY

Technical Problem

In a display device according to conventional technology, the duration (frame period) during which one screen's worth of data is displayed is set to be constant, and thus a duty ratio, which is the ratio of a light emission period to a frame period, is determined based on an estimated number of vertical lines. Then, the display device is controlled by a video image signal and a synchronization signal such that light emission is performed based on the duty ratio and a display is provided at pre-set light emission and light extinction timings.

However, because the frame period is variable depending on the content processed by the GPU, the frame period may vary significantly depending on the GPU's processing power, or the like. The duty ratio, which is the ratio of a light emission period to a frame period, varies as well according to the variation of the frame period. This causes a problem in that the pre-set light emission timing does not match the actual display timing, causing a flicker phenomenon in which fine flickering appears on the screen.

In view of the problem described above, it is an object of the present disclosure to provide a display panel control device, a display device, and a method for driving a display panel, with which it is possible to suppress a flicker phenomenon.

Solution to Problem

In order to achieve the object described above, a display panel control device according to one aspect of the present disclosure is a display panel control device that controls display of a display panel including a plurality of pixel circuits that are arranged in rows and columns, the control device including: a data storing unit that temporarily stores a video image signal received from outside; a synchronization control unit that supplies the video image signal from the data storing unit to the display panel based on a vertical synchronization signal received from the outside; and a duty control unit that controls light emission and light extinction of the display panel. The synchronization control unit starts a frame period when the vertical synchronization signal is received, the frame period including a video image period and an extended period, the video image period being a period from after reception of the vertical synchronization signal by the synchronization control unit to end of supply of the video image signal from the data storing unit to the display panel, and the extended period being a period from after end of the video image period to next reception of the vertical synchronization signal by the synchronization control unit. The synchronization control unit initializes the pixel circuits within a predetermined period after the reception of the vertical synchronization signal or detection of a start timing of a video image period signal, temporarily stores the video image signal in the data storing unit after the reception of the vertical synchronization signal or the detection of the start timing of the video image period signal, and causes the data storing unit to supply the video image signal from the data storing unit to the display panel after the initialization and during the video image period. The duty control unit causes the display panel to emit light after the initialization and during the video image period, and controls the display panel such that the display panel emits and extinguishes light at a predetermined duty ratio during the extended period.

With this configuration, a light extinction and initialization period of the display panel is set immediately after the start of the video image period, and thus even if the frame period varies, the light extinction and initialization period can be secured. Also, because the control device includes a data storing unit, the video image signal received from the outside immediately after the start of the video image period can be temporarily stored in the data storing unit. Accordingly, in each frame, a constant light extinction and initialization period can be secured even immediately after the start of the video image period. Also, an extended period is provided after the video image period, and thus even if the frame period varies due to the GPU's processing power or the like, constant signal processing and video image display can be performed during the video image period, and the amount of time corresponding to the variation can be adjusted by the extended period. As a result, it is possible to suppress a flicker phenomenon in the display panel.

Also, the predetermined duty ratio may be a ratio of a length of a light emission period of the display panel during the video image period to a length of the video image period.

With this configuration, even if one frame period varies due to the GPU's processing power or the like, and an extended period is provided, the proportion between light emission and light extinction of the video image signal is the same in the video image period and the extended period. Accordingly, in the display device controlled by the control device, it is possible to suppress a flicker phenomenon.

Also, the duty control unit may include: a sequencer that outputs a sequence of light emission and light extinction of the display panel; and a light emission control unit that controls the light emission and light extinction of the display panel based on the sequence output from the sequencer.

With this configuration, a stable display is possible based on the sequence output from the sequencer.

Also, the sequencer may include: a video image period counter that counts a length of the video image period; a light extinction period counter that counts a length of a light extinction period in the video image period during which the display panel extinguishes light; a light emission period counter that counts a length of a light emission period in the video image period during which the display panel emits light; and a sequence control unit that generates the sequence of light emission and light extinction of the display panel based on count values of the video image period counter, the light extinction period counter, and the light emission period counter.

With this configuration, a new sequence can be generated based on the count values of the video image period counter, the light extinction period counter, and the light emission period counter, and thus an optimal display can be provided each time.

Also, the light emission control unit may output a light extinction signal for causing the display panel to extinguish light.

With this configuration, it is possible to cause the display panel to extinguish light when the light extinction signal is supplied, and cause the display panel to emit light when the light extinction signal is not supplied, and thus the light emission and the light extinction can be controlled by using only a single control signal. Accordingly, it is possible to conveniently perform display control by reducing the number of control signals.

Also, in order to achieve the object described above, a display device according to one aspect of the present disclosure is a display device including: a panel unit in which a plurality of pixel circuits that include light emitting elements are arranged in rows and columns; a source driving circuit that supplies a video image signal to the pixel circuits, the video image signal being a signal that is displayed on the panel unit; a gate driving circuit that supplies a synchronization signal to the pixel circuits, the synchronization signal being a signal for controlling a display timing of the video image signal that is displayed on the panel unit; and a control device that controls the gate driving circuit and the source driving circuit. The control device includes: a data storing unit that temporarily stores a video image signal received from outside; a synchronization control unit that supplies the video image signal from the data storing unit to the pixel circuits based on a vertical synchronization signal received from the outside; and a duty control unit that controls light emission and light extinction of the light emitting elements. The synchronization control unit starts a frame period when the vertical synchronization signal is received, the frame period including a video image period and an extended period, the video image period being a period from after reception of the vertical synchronization signal by the synchronization control unit to end of supply of the video image signal from the data storing unit to the pixel circuits, and the extended period being a period from after end of the video image period to next reception of the vertical synchronization signal by the synchronization control unit. The synchronization control unit initializes the pixel circuits within a predetermined period after the reception of the vertical synchronization signal or detection of a start timing of a video image period signal, temporarily stores the video image signal in the data storing unit after the reception of the vertical synchronization signal or the detection of the start timing of the video image period signal, and causes the data storing unit to supply the video image signal from the data storing unit to the pixel circuits after the initialization and during the video image period. The duty control unit causes the light emitting elements to emit light after the initialization and during the video image period, and controls the gate driving circuit such that the light emitting elements emit and extinguish light at a predetermined duty ratio during the extended period.

With this configuration, a light extinction and initialization period of the light emitting elements is set immediately after the start of the video image period, and thus even if the frame period varies, the light extinction and initialization period of the light emitting elements can be secured. Also, because the display device includes a data storing unit, the video image signal received from the outside immediately after the start of the video image period can be temporarily stored in the data storing unit. Accordingly, in each frame, a constant light extinction and initialization period can be secured even immediately after the start of the video image period. Also, an extended period is provided after the video image period, and thus even if the frame period varies due to the GPU's processing power or the like, constant signal processing and video image display can be performed during the video image period, and the amount of time corresponding to the variation can be adjusted by the extended period. As a result, it is possible to suppress a flicker phenomenon in the display panel.

Also, the predetermined duty ratio may be a ratio of a length of a light emission period of the light emitting elements during the video image period to a length of the video image period.

With this configuration, even if one frame period varies due to the GPU's processing power or the like, and an extended period is provided, the proportion between light emission and light extinction of the video image signal is the same in the video image period and the extended period. Accordingly, in the display device, a flicker phenomenon can be suppressed.

Also, the duty control unit may include: a sequencer that outputs a sequence of light emission and light extinction of the light emitting elements; and a light emission control unit that controls the light emission and light extinction of the light emitting elements based on the sequence output from the sequencer.

With this configuration, a stable display is possible based on the sequence output from the sequencer.

Also, the sequencer may include: a video image period counter that counts a length of the video image period; a light extinction period counter that counts a length of a light extinction period in the video image period during which the light emitting elements extinguish light; a light emission period counter that counts a length of a light emission period in the video image period during which the light emitting elements emit light; and a sequence control unit that generates the sequence of light emission and light extinction of the light emitting elements based on count values of the video image period counter, the light extinction period counter, and the light emission period counter.

With this configuration, a new sequence can be generated based on the count values of the video image period counter, the light extinction period counter, and the light emission period counter, and thus an optimal display can be provided each time.

Also, the light emission control unit may output a light extinction signal for causing the light emitting elements to extinguish light.

With this configuration, it is possible to cause the display panel to extinguish light when the light extinction signal is supplied, and cause the display panel to emit light when the light extinction signal is not supplied, and thus the light emission and the light extinction can be controlled by using only a single control signal. Accordingly, it is possible to conveniently perform display control by reducing the number of control signals.

Also, in order to achieve the object described above, a method for driving a display panel according to one aspect of the present disclosure is a method for driving a display panel that includes a plurality of pixel circuits that are arranged in rows and columns, the method including: starting a frame period when a vertical synchronization signal is received, the frame period including a video image period and an extended period, the video image period being a period from after reception of the vertical synchronization signal to end of supply of a video image signal to the pixel circuits, and the extended period being a period from after end of the video image period to next reception of the vertical synchronization signal; initializing the pixel circuits within a predetermined period after the reception of the vertical synchronization signal or detection of a start timing of a video image period signal; after the reception of the vertical synchronization signal or the detection of the start timing of the video image period signal, temporarily storing the video image signal in a data storing unit; after the initialization and during the video image period, supplying the video image signal from the data storing unit to the pixel circuits; after the initialization and during the video image period, displaying the video image signal by causing a light emitting element provided in each of the plurality of pixel circuits to emit light; and during the extended period, performing light emission and light extinction of the light emitting elements at a predetermined duty ratio.

With this configuration, a light extinction and initialization period of the display panel is set immediately after the start of the video image period, and thus even if the frame period varies, the light extinction and initialization period can be secured. Also, the video image signal received from the outside immediately after the start of the video image period is temporarily stored in the data storing unit, and thus in each frame, a constant light extinction and initialization period can be secured even immediately after the start of the video image period. Also, an extended period is provided after the video image period, and thus even if the frame period varies due to the GPU's processing power or the like, constant signal processing and video image display can be performed during the video image period, and the amount of time corresponding to the variation can be adjusted by the extended period. As a result, it is possible to suppress a flicker phenomenon in the display panel.

Also, the predetermined duty ratio may be a ratio of a length of a light emission period of the light emitting elements during the video image period to a length of the video image period.

With this configuration, even if one frame period varies due to the GPU's processing power or the like, and an extended period is provided, the proportion between light emission and light extinction of the video image signal is the same in the video image period and the extended period. Accordingly, in the display panel, a flicker phenomenon can be suppressed.

Advantageous Effects

With the display panel control device, the display device, and the method for driving a display panel according to the present disclosure, it is possible to suppress a flicker phenomenon.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT

Figure 1:
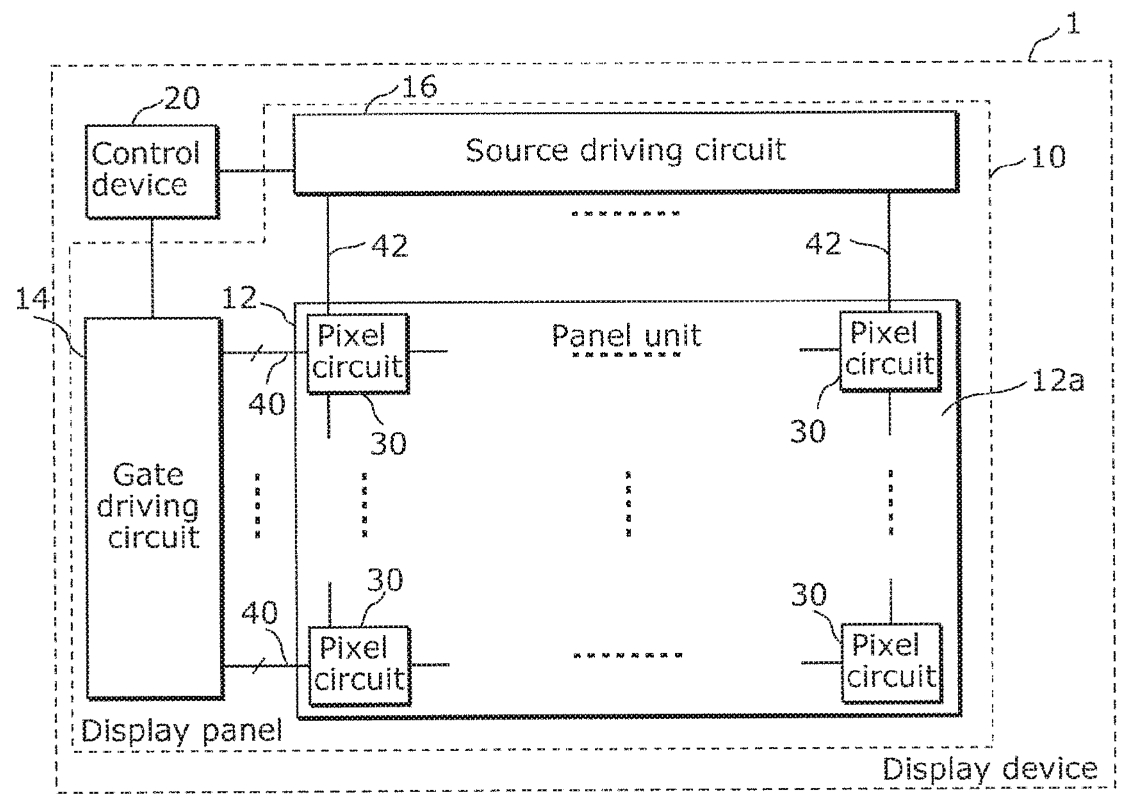
FIG. 1 is a schematic diagram showing an example of a configuration of a display device according to an embodiment.

Hereinafter, an embodiment according to the present disclosure will be described. The embodiment described below is a specific example of the present disclosure. Accordingly, the numerical values, shapes, materials, structural elements, the arrangement and connection of the structural elements, steps, the order of the steps, and the like shown in the following embodiment are merely examples, and therefore are not intended to limit the scope of the present disclosure. Thus, among the structural elements described in the following embodiment, structural elements not recited in any one of the independent claims are described as arbitrary structural elements.

Also, the diagrams are schematic representations, and thus are not necessarily true to scale. In the diagrams, structural elements that are substantially the same are given the same reference numerals, and a redundant description is omitted or simplified.

Embodiment

Hereinafter, an embodiment will be described with reference to FIGS. 1 to 9B. The present embodiment will be described by taking a display device 1 that uses organic electroluminescent (EL) elements as an example of the display device according to the present disclosure.

1. Configuration of Display Device

Figure 2:
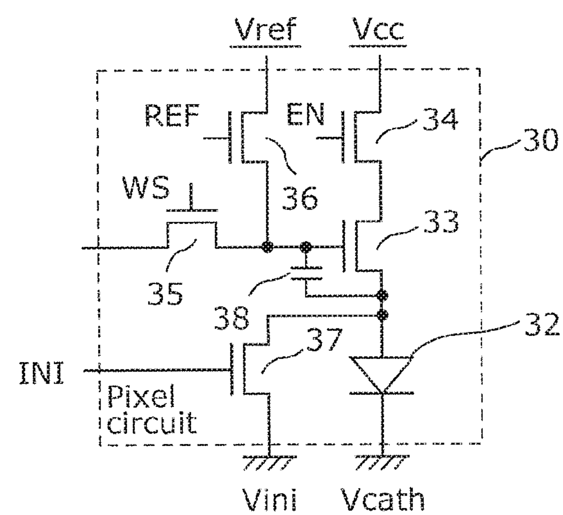
FIG. 2 is a circuit diagram showing a configuration of a pixel circuit according to the embodiment.
Figure 3:
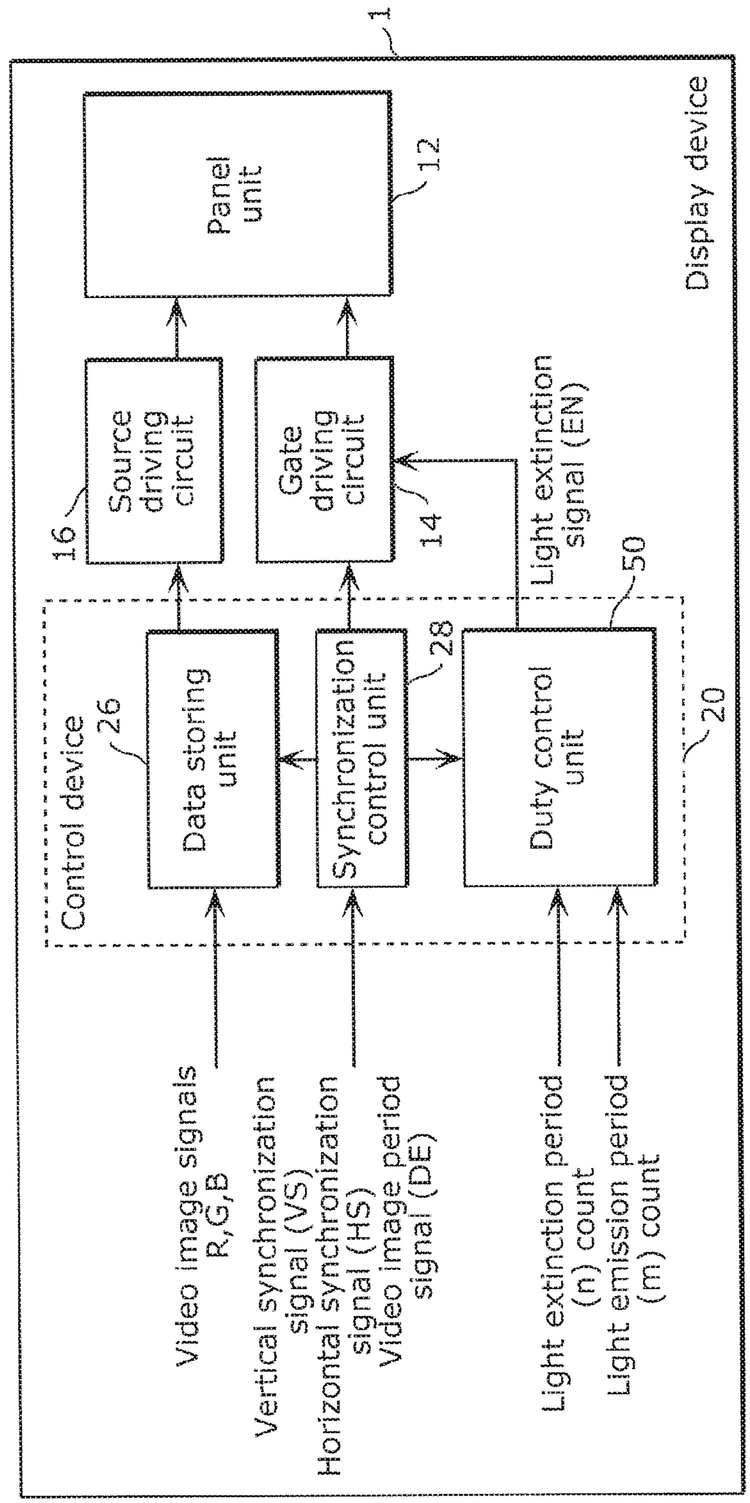
FIG. 3 is a block diagram showing a configuration of a display device according to the embodiment.

First, a configuration of a display device 1 will be described. FIG. 1 is a schematic diagram showing an example of a configuration of the display device 1 according to the present embodiment. FIG. 2 is a circuit diagram showing a configuration of a pixel circuit 30 according to the present embodiment. FIG. 3 is a block diagram showing a configuration of the display device 1 according to the present embodiment.

As shown in FIG. 1, the display device 1 includes a display panel 10, and a control device 20. The display panel 10 includes a panel unit 12, a gate driving circuit 14, a source driving circuit 16, scanning lines 40, and signal lines 42. The panel unit 12, the gate driving circuit 14, the source driving circuit 16, the scanning lines 40, and the signal lines 42 are mounted on, for example, a panel substrate 12*a*.

The panel unit 12 includes a panel substrate 12*a* that was mentioned above, a plurality of pixel circuits 30 that are arranged in rows and columns on the panel substrate 12*a*, scanning lines 40, and signal lines 42 that were also mentioned above. To be more specific, the panel unit 12 includes scanning lines 40 arranged in rows, signal lines 42 arranged in columns, and pixel circuits 30 each including a light emitting element 32 disposed at a portion where a scanning line and a signal line intersects. The panel substrate 12*a* is made of, for example, glass or a resin such as acrylic resin.

The plurality of pixel circuits 30 are formed on the panel substrate 12*a* by, for example, a semiconductor process. The plurality of pixel circuits 30 are arranged in, for example, N rows and M columns. The values N and M vary depending on the size and resolution of the display screen. For example, in the case where pixel circuits 30 corresponding to three primary colors of R, G, and B are provided side by side in a row at a resolution called a high definition (HD), N represents at least 1080 rows, and M represents at least 1920×3 columns. Each pixel circuit 30 includes an organic EL element as the light emitting element, and constitutes any one of the light emitting pixels of three primary colors of R, G, and B.

As shown in FIG. 2, a pixel circuit 30 includes a light emitting element 32, a driving transistor 33, a selection transistor 35, switch transistors 34, 36 and 37, and a pixel capacitor 38. A configuration and operations of the pixel circuit 30 will be described later in detail.

A scanning line 40 is provided for each row of the plurality of pixel circuits 30 that are arranged in rows and columns. One end of the scanning line 40 is connected to the output terminal of a corresponding stage of the gate driving circuit 14.

A signal line 42 is provided for each column of the plurality of pixel circuits 30 that are arranged in rows and columns. One end of the signal line 42 is connected to the output terminal of a corresponding stage of the source driving circuit 16.

The gate driving circuit 14 is a driving circuit that is also called "row driving circuit" and that scans a gate driving signal per row of the pixel circuits 30. The gate driving signal is a signal that is input into the gates of the driving transistor 33, the selection transistor 35, and the switch transistors 34, 36 and 37 of each pixel circuit 30 so as to perform control to turn each transistor on and off. The gate driving circuit 14 outputs, for example, a control signal WS, a light extinction signal EN, a control signal REF, and a control signal INI as the signals for controlling the selection transistor 35, and the switch transistors 34, 36 and 37. Also, as shown in FIG. 1, the gate driving circuit 14 is provided on one of the short sides of the panel unit 12.

The gate driving circuit 14 is, for example, a shift register, or the like. In response to receiving a video image period signal DE from the control device 20, the gate driving circuit 14 outputs a gate driving signal in synchronization with a vertical synchronization signal VS that is also provided from the control device 20, and drives the scanning lines 40. As a result, pixel circuits 30 are line sequentially selected for each frame, and the light emitting elements 32 of the pixel circuits 30 emit light at a luminance according to the video image signal.

As shown in FIG. 1, the gate driving circuit 14 may be provided on one of the short sides of the panel unit 12, or may be provided on each of the opposing short sides of the panel unit 12. As a result of the gate driving circuit 14 being provided on each of the opposing short sides of the panel unit 12, it is possible to supply the same gate driving signal to the plurality of pixel circuits 30 that are disposed on the panel unit 12 at the same timing. Accordingly, for example, if the panel unit 12 is large-sized, it is possible to suppress a signal degradation caused by the interconnect capacitance of the scanning lines 40.

The source driving circuit 16 is a driving circuit that is also called "column driving circuit" and that supplies a video image signal that is supplied per frame from the control device 20 to each pixel circuit 30. The source driving circuit 16 is provided on one of the long sides of the panel unit 12.

The source driving circuit 16 is a current writing type or voltage writing type driving circuit that writes luminance information based on the video image signal into each pixel circuit 30 in the form of a current value or a voltage value through the signal lines 42. As the source driving circuit 16 according to the present embodiment, for example, a voltage writing type driving circuit is used. The source driving circuit 16 supplies a voltage that represents the brightness of the light emitting element 32 provided in each pixel circuit 30 to the signal lines 42 based on the video image signal input from the control device 20.

The video image signal input from the control device 20 to the source driving circuit 16 includes, for example, digital serial data of each of three primary colors of R, G, and B (video image signals R, G, and B). The video image signals R, G, and B input to the source driving circuit 16 are converted to parallel data per row within the source driving circuit 16. Furthermore, the parallel data per row is converted to analog data per row within the source driving circuit 16, which is then output to the corresponding signal line 42. The voltage output to the signal line 42 is written into the pixel capacitors 38 of the pixel circuits 30 that belong to the row selected through scanning performed by the gate driving circuit 14. That is, an electric charge corresponding to the voltage output to the signal line 42 is accumulated in the pixel capacitors 38.

As shown in FIG. 1, the source driving circuit 16 may be provided on one of the long sides of the panel unit 12, or may be provided on each of the opposing long sides of the panel unit 12.

With this configuration, for example, if the panel unit 12 is large-sized, it is possible to output voltage to the pixel circuits 30 of the same column at the same timing.

2. Configuration of Pixel Circuit

As shown in FIG. 2, a pixel circuit 30 includes a light emitting element 32, a driving transistor 33, a selection transistor 35, switch transistors 34, 36 and 37, and a pixel capacitor 38.

The light emitting element 32 is, for example, a diode-type organic EL element that includes an anode and a cathode. The light emitting element 32 is not limited to an organic EL element, and may be any other light emitting element. For example, the light emitting element 32 can be any ordinary element that is current-driven and emits light.

The light emitting element 32 includes; for example, a plurality of first electrode layers that are made of transparent conductive films; an organic layer in which a positive hole transport layer, a light emission layer, an electron transport layer, and an electron injection layer are deposited in this order on the first electrode layers; and a second electrode layer that is made of a metal film and is provided on the organic layer. In FIG. 2, the light emitting element 32 is schematically indicated by a symbol. When a direct current voltage is applied between the first electrode layers and the second electrode layer of the light emitting element 32, recombination of electrons and positive holes takes place in the light emission layer. As a result, due to the drain-to-source current of the driving transistor 33 supplied from the driving transistor 33, the light emitting element 32 emits light at a luminance according to the signal potential of the video image signal.

The driving transistor 33 is an active element that drives the light emitting element 32 to emit light. The driving transistor 33 supplies the drain-to-source current that corresponds to the gate-to-source voltage to the light emitting element 32 by being turned on.

The switch transistor 34 is turned on or off according to the light extinction signal EN supplied from the scanning line 40. The switch transistor 34 connects the driving transistor 33 to a power supply Vcc by being turned on, and the drain-to-source current of the driving transistor 33 is supplied to the light emitting element 32.

The selection transistor 35 is turned on according to the control signal WS supplied from the scanning line 40, and an electric charge corresponding to the signal potential of the video image signal supplied from the signal line 42 is accumulated in the pixel capacitor 38.

The switch transistor 36 is turned on according to the control signal REF supplied from the scanning line 40, and sets the source of the driving transistor 33 to a reference voltage Vref.

The switch transistor 37 is turned on according to the control signal INI supplied from the scanning line 40, and sets the source of the driving transistor 33 to a reference voltage Vini.

The pixel capacitor 38 applies a voltage to the gate of the driving transistor 33 according to the signal potential based on the accumulated electric charge.

The driving transistor 33, the selection transistor 35, the switch transistor 36, and the switch transistor 37 are, for example, N channel type polysilicon TFTs (Thin Film Transistors). Also, the switch transistor 34 is, for example, a P channel type polysilicon TFT. The conductivity type of the transistors is not limited to the above, and N channel type and P channel type TFTs may be mixed as appropriate. Also, the transistors are not limited to polysilicon TFTs, and may be amorphous silicon TFTs, or the like.

Operations performed by the pixel circuit 30 will now be described. Immediately before a frame period starts, all of the control signals WS, REF, and INI as well as the light extinction signal EN are at a low level. In this state, the selection transistor 35, the switch transistor 36, and the switch transistor 37 that are N channel type transistors are turned off. On the other hand, the switch transistor 34 that is a P channel type transistor is turned on.

Accordingly, the driving transistor 33 is connected to the power supply Vcc via the switch transistor 34 that is in an on-state. As a result, the driving transistor 33 supplies the drain-to-source current to the light emitting element 32 according to the gate-to-source voltage of the driving transistor 33. At this time, the light emitting element 32 emits light.

When the frame period starts, the light extinction signal EN is switched from the low level to a high level. In response thereto, the switch transistor 34 is turned off, and the driving transistor 33 is disconnected from the power supply Vcc. Accordingly, the light emitting element 32 stops emitting light, and a light extinction period starts. Also, all of the selection transistor 35, the switch transistor 36, the switch transistor 37, and the switch transistor 34 are turned off.

During an initialization period, first, the reference voltage Vref is changed to a voltage at which the driving transistor 33 is turned off when the control signal REF is set to a high level. Next, the control signal REF is set to a high level, and the switch transistor 36 is turned on. In response thereto, the gate of the driving transistor 33 is connected to the reference voltage Vref, and the driving transistor 33 is turned off. When the driving transistor 33 is turned off, the control signal REF is again set to a low level, and the switch transistor 36 is turned off. Furthermore, the reference voltage Vref is brought back to the original voltage.

Next, the control signal INI is set to a high level, and the switch transistor 37 is turned on. In response thereto, the source of the driving transistor 33 is initialized to the reference voltage Vini. Then, when the control signal REF is set to a high level, the switch transistor 36 is turned on. In response thereto, the gate of the driving transistor 33 is initialized to the reference voltage Vref. As a result, the gate of the driving transistor 33 is connected to the reference voltage Vref, and the source is connected to the reference voltage Vini.

Here, the reference voltage Vref, the reference voltage Vini, and a threshold voltage Vth of the driving transistor 33 may satisfy the relationship: Vref−Vini>Vth. By doing so, the threshold voltage Vth of the driving transistor 33 can be corrected later. Also, by setting a threshold voltage of the light emitting element 32 to be greater than the reference voltage Vini, a minus bias is applied to the light emitting element 32, and the light emitting element 32 is brought into a so-called reverse bias state.

When the initialization period ends, the threshold voltage Vth of the driving transistor 33 is detected, and the threshold voltage Vth is corrected if necessary (Vth correction period). After the control signal INI is set to a low level, the light extinction signal EN is set to a low level. In response thereto, the switch transistor 37 is turned off, and the switch transistor 34 is turned on. Then, the drain-to-source current of the driving transistor 33 flows through the pixel capacitor 38, and the correction of the threshold voltage Vth is performed.

At this time, the gate of the driving transistor 33 is held at the reference voltage Vref, and the drain-to-source current of the driving transistor 33 flows through the driving transistor 33 until the driving transistor 33 is cut off. When the driving transistor 33 is cut off, the source of the driving transistor 33 has a potential Vref-Vth.

Then, the light extinction signal EN is again set to a high level, and the switch transistor 34 is turned off. Furthermore, the control signal REF is set to a low level, and the switch transistor 36 is turned off. The threshold voltage Vth is thereby held in the pixel capacitor 38.

After that, the light extinction signal EN is again set from the low level to a high level, and the control signal REF is set from the high level to a low level. Subsequently, the control signal WS is set from the low level to a high level. As a result, the signal potential of the video image signal is written into the pixel capacitor 38.

Furthermore, the light extinction signal EN is set from the high level to a low level. The light emitting element 32 thereby starts emitting light.

By repeating the frame period described above, the light emitting elements 32 that are arranged in rows and columns sequentially emit light according to the signal potential of the video image signal, and a video image is displayed on the panel unit 12.

3. Configuration of Control Device

Next, a configuration of the control device 20 will be described.

The control device 20 is formed on an external system circuit substrate (not shown) provided outside the display panel 10. The control device 20 functions as, for example, a TCON (Timing Controller), and controls the overall operations of the display device 1. TO be specific, the control device 20 provides an instruction to perform scanning to the gate driving circuit 14 according to a vertical synchronization signal VS, a horizontal synchronization signal HS, and a video image period signal DE that are supplied from the outside. Also, the control device 20 supplies digital serial data of video image signals R, G, and B to the source driving circuit 16.

As shown in FIG. 3, the control device 20 includes a data storing unit 26, a synchronization control unit 28, and a duty control unit 50. The control device 20 may include a receiver (not shown) that receives a signal supplied from the outside and supplies the signal to the data storing unit 26, the synchronization control unit 28, and the duty control unit 50.

The data storing unit 26 is a buffer that temporarily stores the video image signals R, G, and B. The data storing unit 26 includes, for example, 100 line buffers. The data storing unit 26 sequentially stores the video image signals R, G, and B for each line received from the outside, and outputs the video image signals to the source driving circuit 16 at a predetermined timing.

The synchronization control unit 28 is a control unit that controls the timing at which the video image signals R, G, and B are displayed on the panel unit 12. The synchronization control unit 28 receives a vertical synchronization signal VS, a horizontal synchronization signal HS, and a video image period signal DE from the outside, and outputs the signals to the gate driving circuit 14 and the source driving circuit 16. Also, the synchronization control unit 28 outputs, to the duty control unit 50, count triggers for a video image period counter 54*b*, a light extinction period counter 54*c*, and a light emission period counter 54*d* that will be described later to start counting.

Figure 4:
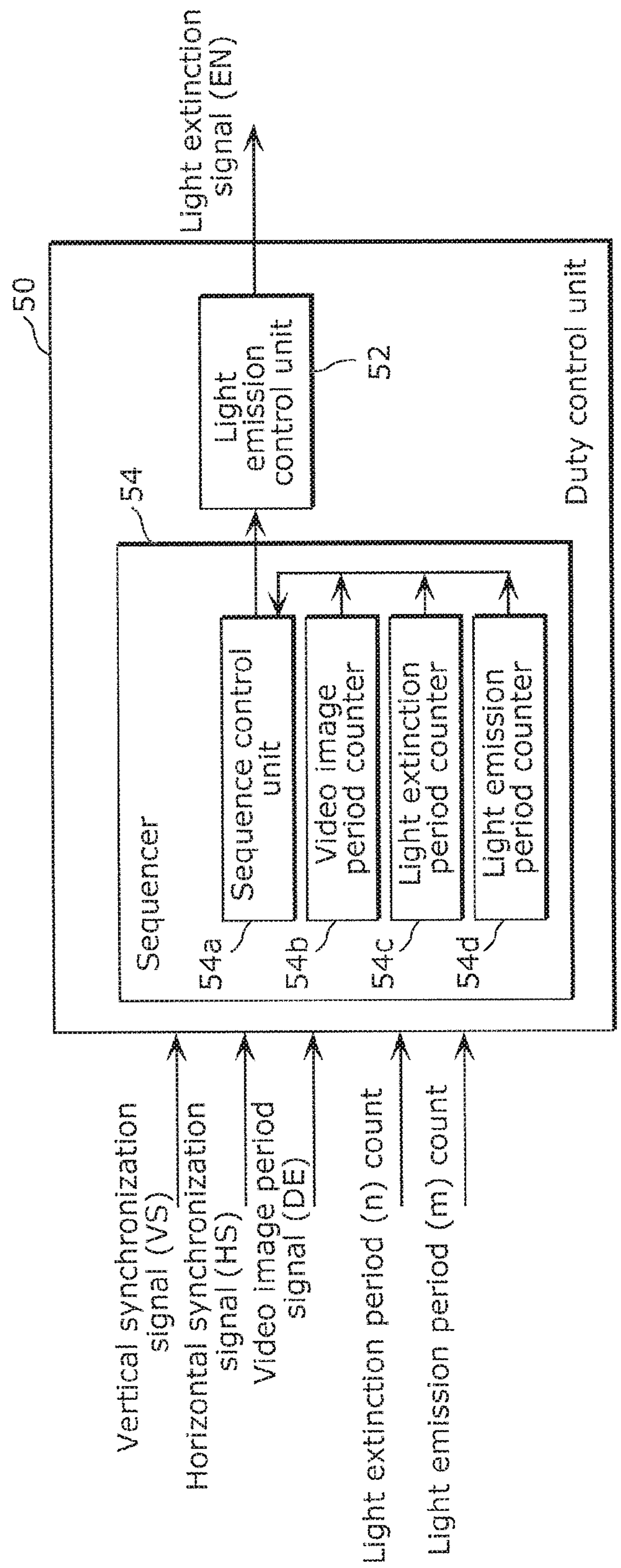
FIG. 4 is a block diagram showing a configuration of a duty control unit according to the embodiment.

FIG. 4 is a block diagram showing a configuration of the duty control unit 50 according to the present embodiment. The duty control unit 50 is a control unit that controls the gate driving circuit 14 and the source driving circuit 16 such that the video image signals R, G, and B are displayed on the panel unit 12 at a desired timing.

As shown in FIG. 4, the duty control unit 50 includes a light emission control unit 52, and a sequencer 54. In the duty control unit 50, the sequencer 54 sets the duty ratio of a light emission period to a light extinction period within one frame according to the video image period signal DE, and the light emission control unit 52 causes each light emitting element 32 to emit or extinguish light according to the set duty ratio.

The light emission control unit 52 is a control unit that controls light emission and light extinction of the light emitting elements 32. The light emission control unit 52 generates a light extinction signal EN based on the sequence output from the sequencer 54, and supplies the light extinction signal EN to the gate driving circuit 14. As a result, the gate driving circuit 14 supplies or stops supplying the light extinction signal EN to the switch transistor 34 of each pixel circuit 30 based on the sequence output from the sequencer 54, and controls light emission and light extinction of each light emitting element 32.

The sequencer 54 includes a sequence control unit 54*a*, a video image period counter 54*b*, a light extinction period counter 54*c*, and a light emission period counter 54*d*.

The sequence control unit 54*a* generates a sequence for controlling the display timing of the video image signals R, G, and B based on the vertical synchronization signal VS, the horizontal synchronization signal HS, and the video image period signal DE that are supplied from the outside. Also, the sequence control unit 54*a* receives a supply of count values that represent the lengths of a video image period, a light extinction period, and a light emission period from the video image period counter 54*b*, the light extinction period counter 54*c*, and the light emission period counter 54*d*.

The video image period counter 54*b* is a counter for counting the video image period received from the outside. The light extinction period counter 54*c* is a counter for counting a light extinction period during which the light emitting elements 32 actually extinguish light. The light emission period counter 54*d* is a counter for counting a light emission period during which the light emitting elements 32 actually emit light. The video image period counter 54*b*, the light extinction period counter 54*c*, and the light emission period counter 54*d* are, for example, timers. The video image period counter 54*b*, the light extinction period counter 54*c*, and the light emission period counter 54*d* start counting in response to the count triggers supplied from the synchronization control unit 28.

The sequence (timing chart) generated by the sequence control unit 54*a* will be described later in detail.

4. Operations of Control Device

A description will now be given of operations performed in the control device 20 according to the present embodiment.

The display device 1 according to the present embodiment is driven by, for example, a progressive driving scheme for organic EL light emitting panels. To be specific, the control device 20 performs control so as to cause the panel unit 12 in which a plurality of pixel circuits 30 are arranged in rows and columns to perform an initialization operation, a write operation, and a light emission operation in a row-sequential manner. That is, under the control of the control device 20, an initialization operation, a write operation, and a light emission operation are sequentially performed from the first row to the last row in the panel unit 12. This period will be referred to as a "frame period". The frame period may include a threshold voltage Vth detection operation of detecting the threshold voltage Vth of the driving transistor 33, and the like, in addition to the initialization operation, the write operation, and the light emission operation.

Figure 5A:
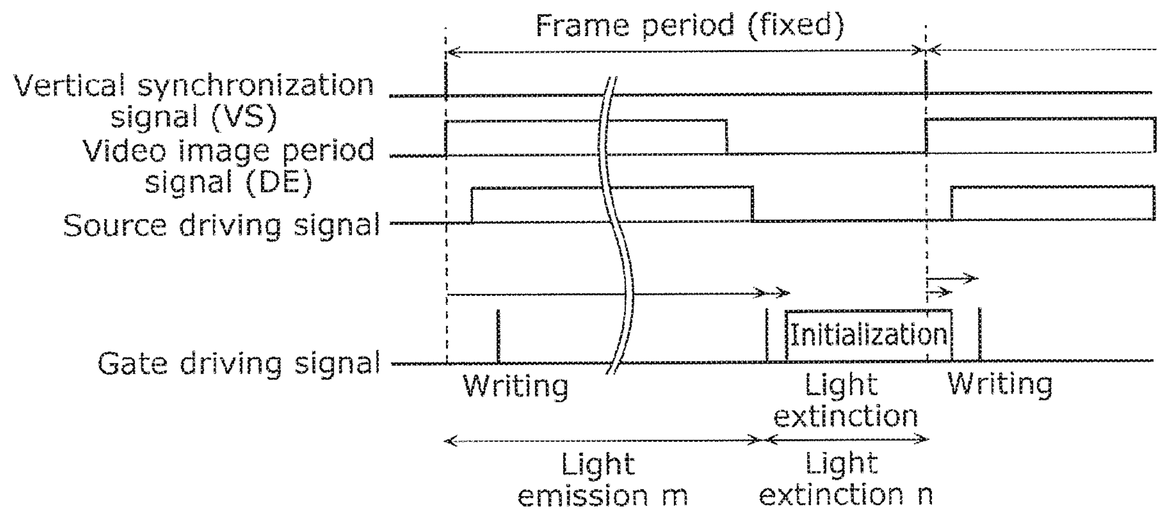
FIG. 5A is a timing chart schematically illustrating operations performed in a control device according to a comparative example.
Figure 5B:
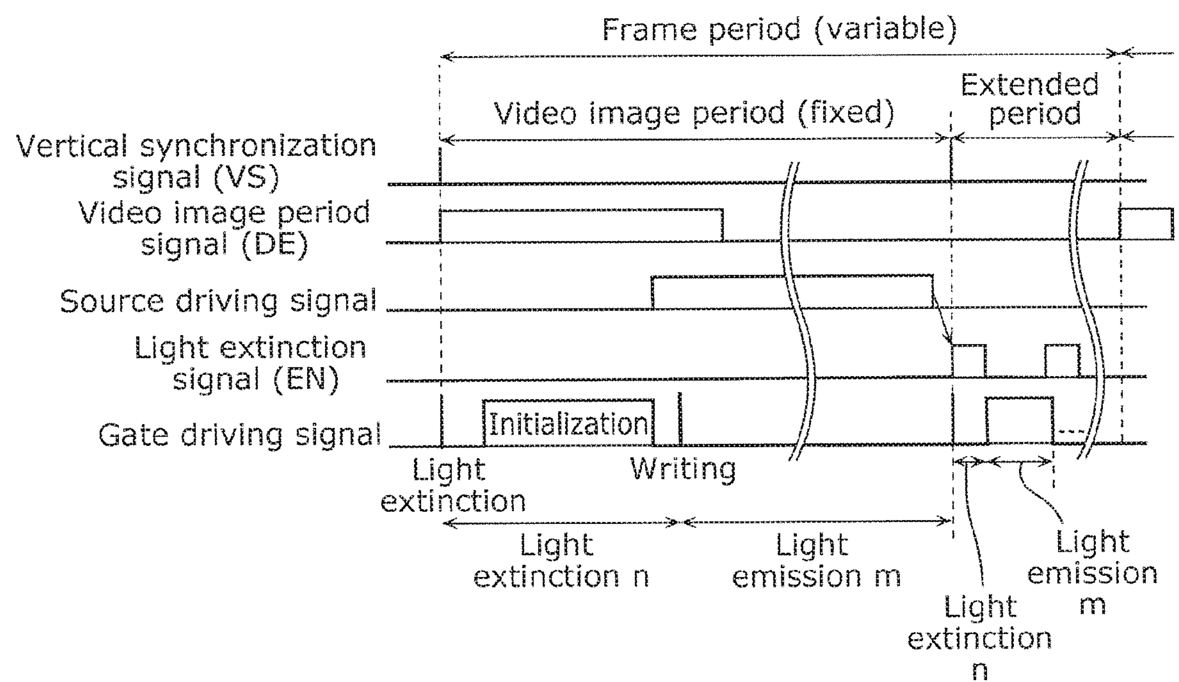
FIG. 5B is a timing chart schematically illustrating operations performed in the control device according to the embodiment.

Here, a feature of the operations performed in the control device 20 according to the present embodiment will be described. FIG. 5A is a timing chart schematically illustrating operations performed in a control device according to a comparative example. FIG. 5B is a timing chart schematically illustrating operations performed in the control device according to the present embodiment.

In an ordinary display device, the frame period is a fixed frame period that is set to a constant period. As shown in FIG. 5A, when a vertical synchronization signal VS is supplied to the display device (or a control device provided in the display device), a frame period starts. Then, when a video image period signal DE is supplied simultaneously with or subsequently to the supply of the vertical synchronization signal VS, and a source driving signal is supplied following the video image period signal DE, a video image signal is supplied to each pixel circuit 30. Then, when a gate driving signal that contains a write instruction is supplied, writing of the video image signal is performed. At this time, the light emitting element 32 of the pixel circuit 30 is in a light emitting state until a gate driving signal that contains a light extinction instruction is supplied. When a gate driving signal that contains a light extinction instruction is supplied, the light emitting element 32 enters a light extinguishing state, and the pixel circuit 30 is then initialized.

In this case, a light extinction position is set based on the beginning of the frame period, whereas the initialization period is a fixed period set based on the timing at which the rendering of the subsequent frame starts. Accordingly, if the actual frame period becomes longer than the set frame period due to the GPU's processing power, the start of initialization and the start of writing of the pixel circuit 30 for the subsequent frame is delayed. This extends the light extinction period and turns the pixel dark, which causes a flicker phenomenon.

In contrast, the control device 20 according to the present embodiment performs operations so as to cope with the variation of the frame period. As shown in FIG. 5B, in the control device 20, a frame period is configured to include a video image period and an extended period following the video image period. Also, in the control device 20, a light extinction and initialization period of each light emitting element 32 is set immediately after the start of the video image period.

The video image period corresponds to the fixed frame period of an ordinary display device described above, and is a period during which an initialization operation, a write operation, and a light emission operation are sequentially performed from the first row to the last row in the panel unit 12.

Also, during the extended period provided after the end of the video image period, the light emitting elements 32 are caused to emit light at the same duty ratio as that of the video image period. As used herein, the duty ratio refers to an on-duty ratio that is the ratio of a light emission period to one frame period. For example, in the case where one frame period is configured to include a light emission period m and a light extinction period n, the duty ratio is m/(m+n).

As shown in FIG. 5B, in the control device 20, a frame period starts in response to the supply of a vertical synchronization signal VS. Here, a video image period signal DE is supplied simultaneously with or subsequently to the supply of the vertical synchronization signal VS, but as will be described later, the video image signal is temporarily written into the data storing unit 26. Also, simultaneously with or subsequently to the supply of the vertical synchronization signal VS, a gate driving signal that contains a light extinction instruction is supplied, and the light emitting element 32 enters a light extinguishing state. Then, the pixel circuit 30 is initialized while the light emitting element 32 is in the light extinguishing state.

Also, in response to a source driving signal being supplied after the end of initialization, the video image signal is read from the data storing unit 26 and supplied to the pixel circuit 30. In response thereto, the light emitting element 32 of the pixel circuit 30 enters a light emitting state and is in the light emitting state until a gate driving signal that contains a light extinction instruction is supplied next.

Here, in the case where, due to the GPU's processing power or the like, light emission is continued for a length of time longer than the video image period that is a fixed frame period, an extended period is provided. The light emission and light extinction of the light emitting element 32 during the extended period is performed at the same duty ratio as the duty ratio of the fixed frame period. For example, in the case where the duty ratio of the fixed frame period is m/(m+n), the light emission time and the light extinction time are provided in the extended period such that the duty ratio of the extended period also satisfies m/(m+n).

Figure 6:
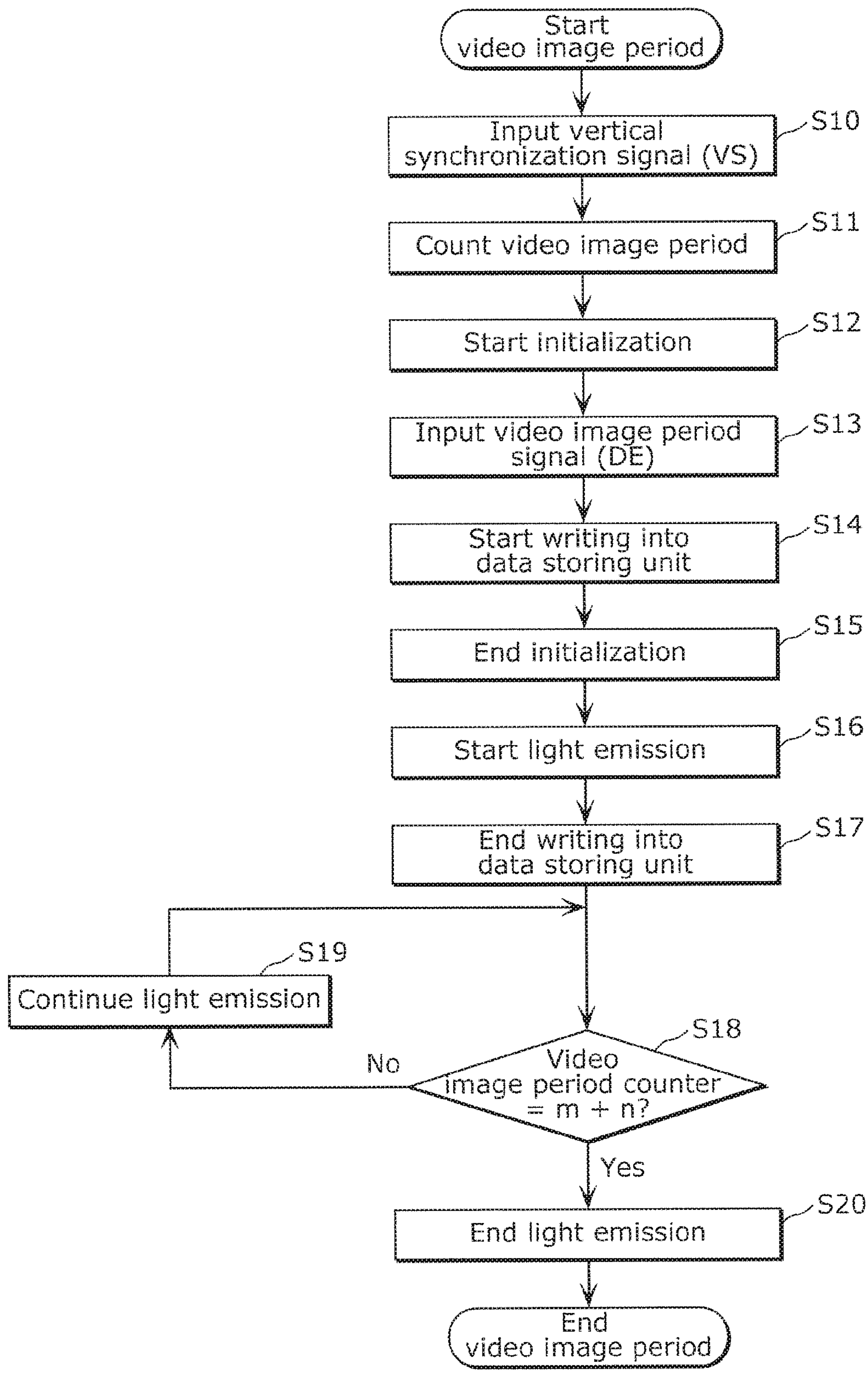
FIG. 6 is a flowchart illustrating operations performed during a video image period in the control device according to the embodiment.
Figure 7:
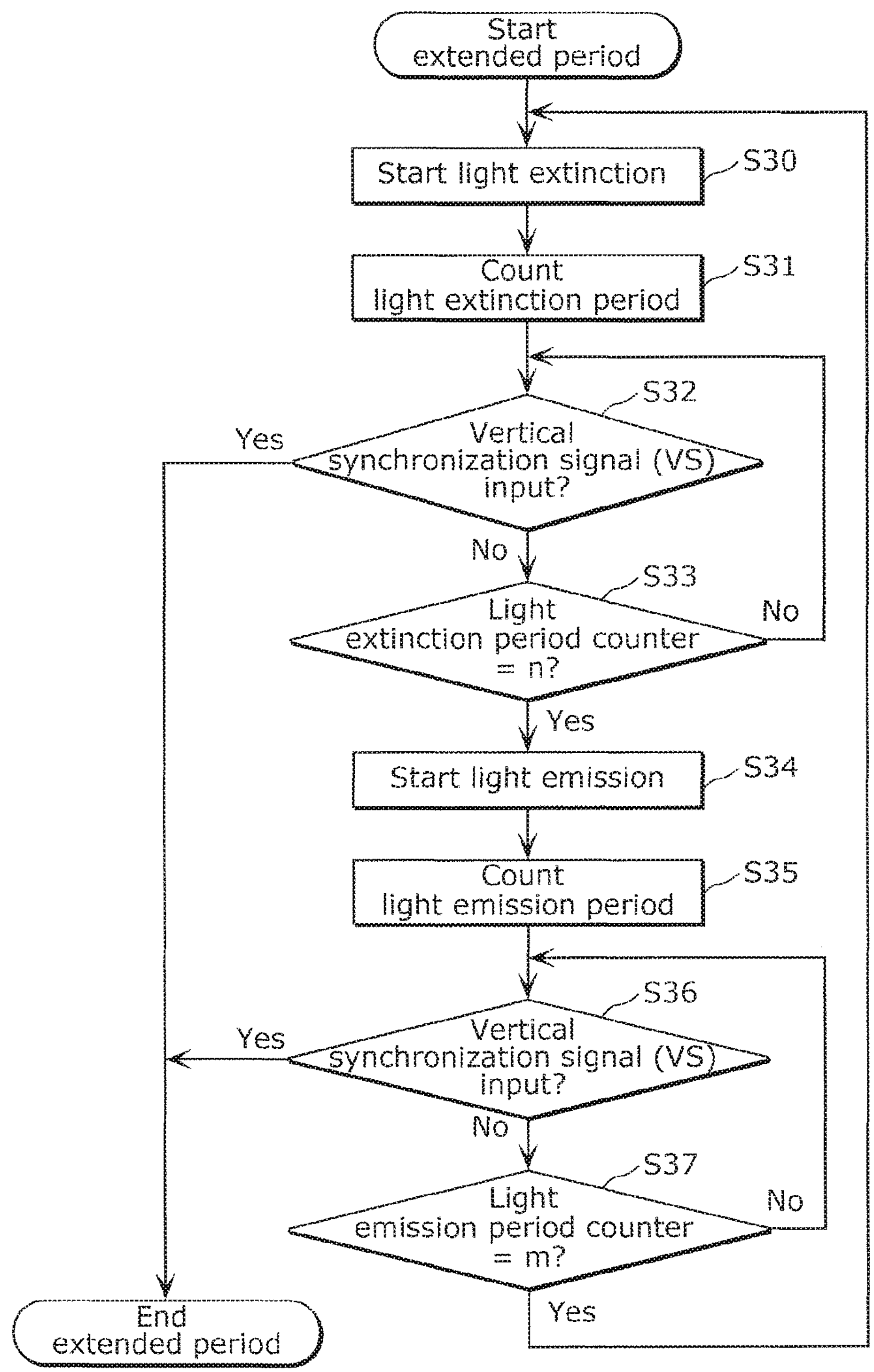
FIG. 7 is a flowchart illustrating operations performed during an extended period in the control device according to the embodiment.
Figure 8:
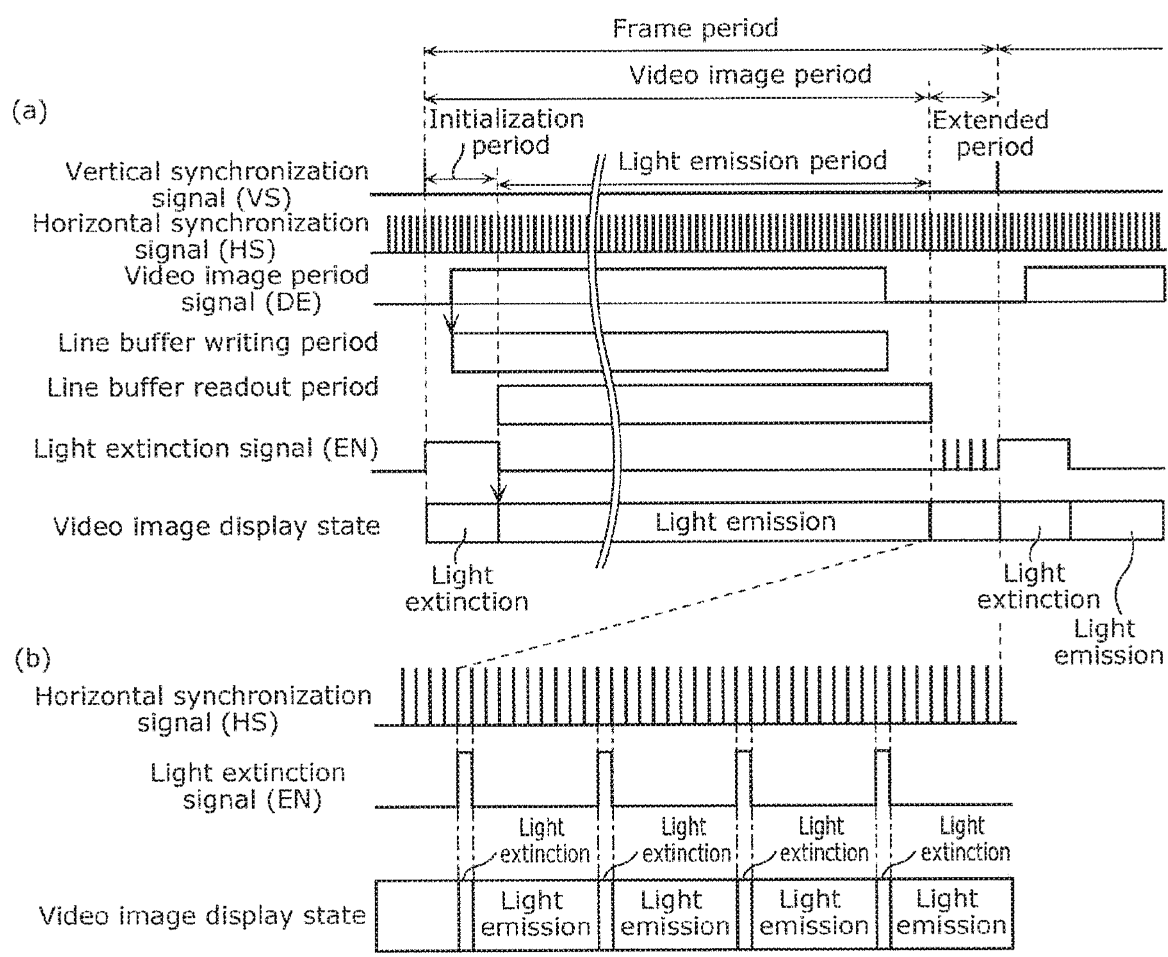
FIG. 8 is a timing chart Illustrating operations performed in the control device according to the embodiment, with (a) showing an operation timing during a frame period, and (b) showing an operation timing during an extended period.

Hereinafter, operations performed in the control device 20 according to the present embodiment will be described. FIG. 6 is a flowchart illustrating operations performed during the video image period in the control device 20 according to the present embodiment. FIG. 7 is a flowchart illustrating operations performed during the extended period in the control device 20 according to the present embodiment. FIG. 8 is a timing chart illustrating operations performed in the control device 20 according to the present embodiment, with (a) showing an operation timing during the frame period, and (b) showing an operation timing during the extended period.

In the example given below, operations performed in the case where the duty ratio is 90% will be described. Also, in the example given below, a video image period m+n is set to a period of 100 pulses of the horizontal synchronization signal, the light extinction period (initialization period) n is set to a period of 10 pulses of the horizontal synchronization signal. The light emission period m is set to a period of 90 pulses of the horizontal synchronization signal.

As shown in FIG. 6 and (a) in FIG. 8, in the control device 20, the video image period starts in response to the supply of a vertical synchronization signal VS (step S10). The vertical synchronization signal VS is supplied to synchronization control unit 28 of the control device 20 from the outside. The vertical synchronization signal VS supplied to the synchronization control unit 28 is output from the synchronization control unit 28 to the duty control unit 50. In response thereto, in the duty control unit 50, the video image period counter 54*b* starts counting the video image period (step S11).

In the video image period counter 54*b*, a video image period having a predetermined length of time has been set in advance. The video image period having a predetermined length of time refers to, for example, the duration required to finish rendering all of the pixel circuits 30 that are disposed on the panel unit 12 (1080 lines worth of pixel circuits in the case of FHD resolution, and 2160 lines worth of pixel circuits in the case of 4K UHD resolution) after the vertical synchronization signal VS has been input. In (a) in FIG. 8, the length of the video image period is set to a period of 100 pulses of the horizontal synchronization signal. The video image period counter 54*b* counts the length of the video image period until it reaches the set count value (m+n=100).

Also, when the vertical synchronization signal VS is output from the synchronization control unit 28, and the duty control unit 50 receives the vertical synchronization signal VS, a light extinction signal EN is supplied from the duty control unit 50 to the gate driving circuit 14. The light extinction signal EN is supplied from the gate driving circuit 14 to the gate of the switch transistor 34 of each pixel circuit 30. In response thereto, the switch transistor 34 is turned off, and the light emitting element 32 enters a light extinguishing state. Then, an initialization period starts (step S12). The start timing of the initialization period is not limited to when the duty control unit 50 receives the vertical synchronization signal VS, and may be when the duty control unit 50 detects start timing of input of a video image period signal DE.

During the initialization period, a gate signal for initialization is supplied from the gate driving circuit 14 to the pixel circuit 30. In response thereto, the transistors of the pixel circuit 30 operate as described above, and the pixel circuit 30 is initialized (initialization step).

A video image period signal DE is also supplied to the synchronization control unit 28 of the control device 20 from the outside (step S13). The supply of the video image period signal DE may be performed during the initialization period, or may be performed after the end of the initialization period. Here, it is assumed that the video image period signal DE is supplied during the initialization period.

When the video image period signal DE is supplied to the synchronization control unit 28, the writing of the video image signal is started (step S14). In response to the input of the video image period signal DE, the video image signal output from the source driving circuit 16 is temporarily written into the data storing unit 26 (writing step). The writing of the video image signal is continued while the video image period signal DE is supplied. The start timing of the writing step is not limited to when the input of the video image period signal DE into the synchronization control unit 28 is started, and may be when the duty control unit 50 receives the vertical synchronization signal VS.

After that, when a predetermined period passes from the start of the initialization, the initialization period ends (step S15). The predetermined period ends when the light extinction period for initialization counted by the light extinction period counter 54*c* reaches a pre-set count value (n=10).

When the initialization period ends, the readout of the video image signal from the data storing unit 26 is started (readout step). Also, the supply of the light extinction signal EN from the gate driving circuit 14 to the pixel circuit 30 is stopped. Accordingly, the supply of the light extinction signal EN to the gate of the switch transistor 34 is stopped, and the switch transistor 34 is turned on. In response thereto, the light emitting element 32 starts emitting light (step S16). The light emitting element 32 emits light according to the video image signal read out from the data storing unit 26 (video image display step).

Also, when the supply of the video image period signal DE is stopped, the writing of the video image signal into the data storing unit 26 ends (step S17).

Here, if the count value of the video image period counter 54*b* does not reach the set value (m+n=100) (No in step S18), the light emitting element 32 continuously emits light (step S19).

If, on the other hand, the count value of the video image period counter 54*b* reaches the set value (m+n=100) (Yes in step S18), the light extinction signal EN is again supplied from the gate driving circuit 14 to each pixel circuit 30. In response thereto, the light emission of the light emitting element 32 during the video image period ends (step S20).

When the video image period ends, an extended period starts (extended display step). As shown in FIG. 7, when the light emitting element 32 finishes emitting light during the video image period, the light extinction of the light emitting element 32 is started (step S30). As described above, in response to the supply of the light extinction signal EN from the gate driving circuit 14 to the pixel circuit 30, the light emitting element 32 extinguishes light, and enters a light extinguishing state and is in the light extinguishing state while the light extinction signal EN is supplied.

When the light emitting element 32 extinguishes light, the light extinction period counter 54*c* starts counting the light extinction period (step S31). As shown in (b) in FIG. 8, the light extinction period n during the extended period is, for example, a period of one pulse of the horizontal synchronization signal (n=1).

Here, if a vertical synchronization signal VS is input after the counting of the light extinction period has been started (Yes in step S32), the extended period ends, and a video image display period for the subsequent frame is started. That is, the light extinction signal EN is supplied from the duty control unit 50 to the gate driving circuit 14, and the steps S10 to S20 described above are performed again.

Also, if a vertical synchronization signal VS is not input after the counting of the light extinction period has been started (No in step S32), if the count value of the light extinction period counter 54*c* reaches the pre-set count value (n=1) (Yes in step S33), the light emitting element 32 starts emitting light (step S34). If the count value of the light extinction period counter 54*c* does not reach the pre-set count value (n=1) (No in step S33), the light extinguishing state of the light emitting element 32 is continued until a vertical synchronization signal VS is input, or the count value of the light extinction period counter 54*c* reaches the pre-set count value (n=1).

If the count value of the light extinction period counter 54*c* reaches the pre-set count value (n=1) (Yes in step S33), the light emitting element 32 emits light as a result of the supply of the light extinction signal EN from the duty control unit 50 to the gate driving circuit 14 being stopped.

When the light emitting element 32 emits light, the light emission period counter 54*d* starts counting the light emission period (step S35). As shown in (b) in FIG. 8, the light emission period m during the extended period is, for example, a period of 9 pulses of the horizontal synchronization signal (m=9).

Furthermore, if a vertical synchronization signal VS is input after the counting of the light emission period has been started (Yes in step S36), the extended period ends, and a video image display period for the subsequent frame is started. That is, the light extinction signal EN is supplied from the duty control unit 50 to the gate driving circuit 14, and the steps S10 to S20 described above are performed again.

Also, if a vertical synchronization signal VS is not input after the counting of the light emission period has been started (No in step S36), if the count value of the light emission period counter 54*d* reaches the pre-set count value (m=9) (Yes in step S37), the light emitting element 32 again extinguishes light (step S30), and the counting of the light extinction period starts (step S31). If the count value of the light extinction period counter 54*c* does not reach the pre-set count value (m=9) (No in step S37), the light emitting state of the light emitting element 32 is continued until a vertical synchronization signal VS is input, or the count value of the light emission period counter 54*d* reaches the pre-set count value (m=9).

Figure 9A:
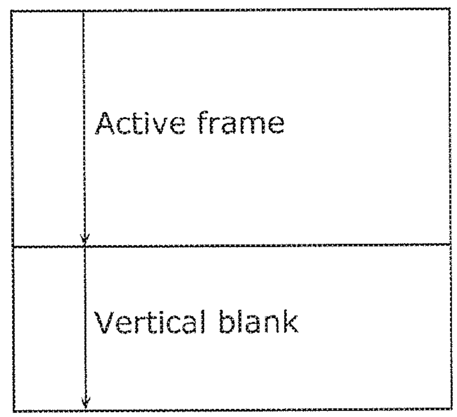
FIG. 9A is a schematic diagram Illustrating an example of display of one frame displayed by a control device according to a comparative example.
Figure 9B:
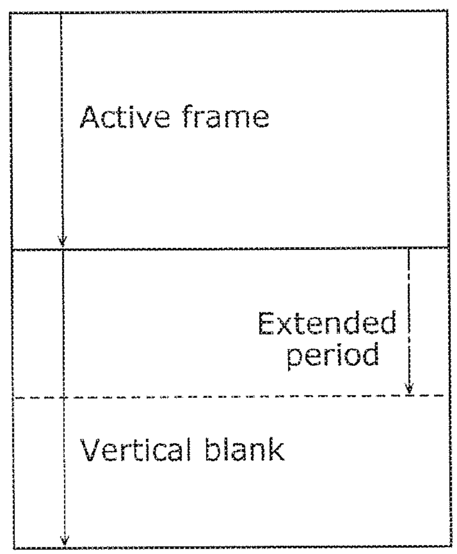
FIG. 9B is a schematic diagram illustrating an example of display of one frame displayed by the control device according to the embodiment.

FIG. 9A is a schematic diagram illustrating an example of display of one frame displayed by a control device according to a comparative example. FIG. 9B is a schematic diagram illustrating an example of display of one frame displayed by the control device 20 according to the embodiment. FIGS. 9A and 9B show an example of display of one frame video image, with the inclusion of the time it takes for scanning to move from the last scanning row of the frame to the start scanning row of the subsequent frame.

As described above, the display device 1 is driven by, for example, a progressive driving scheme for organic EL light emitting panels. That is, the control device 20 sequentially performs an initialization operation, a threshold voltage Vth detection operation, a write operation, and a light emission operation from the foremost first row to the last row in the panel unit 12 in which a plurality of pixel circuits 30 are arranged in rows and columns. This period is referred to as a “frame period”, and is a fixed frame period.

Here, an ordinary display device has a so-called blanking period during a period from the end of a write period of the last row of a frame to the start of a write period of the first row of the subsequent frame. The blanking period refers to the time it takes for the source driving circuit 16 to move scanning from the last scanning row to the start scanning row (the first row in the subsequent frame). Also, a virtual representation of the blanking period by using the number of scanning rows corresponding to the blanking period is referred to as a “vertical blank”. In an ordinary display device, the vertical blank is shown on or after the last row of a display screen (active frame) as shown in FIG. 9A.

Here, in the display device 1 controlled by the control device 20 according to the present embodiment, an extended period is provided after the video image period that is a fixed frame period, and thus the extended period in included in the vertical blank. That is, as shown in FIG. 9B, in the display device 1 controlled by the control device 20, the vertical blank is increased by an amount corresponding to the extended period as compared with that shown in FIG. 9A.

The vertical blank is a virtual row rather than an image that is actually displayed on the panel unit 12. In general, during the vertical blank period, an image corresponding to the active frame prior to the vertical blank is continuously displayed on the panel unit 12.

In the control device 20 according to the present embodiment, the on-duty ratio of the extended period is the same as the duty ratio of the video image period. Accordingly, even if an extended period is provided as a result of one frame period being varied due to the GPU’s processing power or the like, the proportion between light emission and light extinction of the video image signal is the same in the video image period and the extended period. It is therefore possible to suppress a flicker phenomenon in the display device 1 controlled by the control device 20.

5. Advantageous Effects, Etc.

As described above, with the control device 20 and the display device 1 according to the present embodiment, a light extinction and initialization period of the light emitting element is set immediately after the start of the video image period, and thus even if the frame period varies, the light extinction and initialization period can be secured. It is therefore possible to reliably secure a constant light extinction and initialization period for each frame.

Also, in the control device 20 and the display device 1, the frame period is configured to include a video image period and an extended period following the video image period. Also, the duty ratio is the same in the video image period and the extended period, and thus the proportion between light emission and light extinction of the video image signal is the same. Accordingly, in the display device 1 controlled by the control device 20, even if the frame period varies due to the GPU’s processing power or the like, it is possible to suppress a flicker phenomenon.

In the embodiment described above, as the control signal for controlling the light emitting element 32 to emit and extinguish light, the light extinction signal EN that contains a light extinction instruction is used, but it is also possible to use a light emission signal that contains a light emission instruction according to the characteristics of the switch transistor 34.

Variation 1

Figure 10:
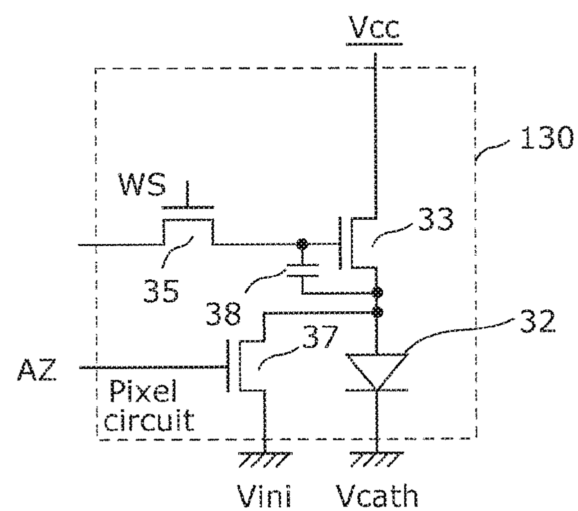
FIG. 10 is a circuit diagram showing a configuration of a pixel circuit according to Variation 1.

FIG. 10 is a circuit diagram showing a configuration of a pixel circuit 130 according to Variation 1. The pixel circuit 130 according to the present variation is different from the pixel circuit 30 according to the embodiment in that the pixel circuit 130 according to the present variation does not include switch transistors 34 and 36.

As shown in FIG. 10, the pixel circuit 130 includes a light emitting element 32, a driving transistor 33, a selection transistor 35, a switch transistor 37, and a pixel capacitor 38. The configurations of the light emitting element 32, the driving transistor 33, the selection transistor 35, the switch transistor 37, and the pixel capacitor 38 are the same as the configurations of the light emitting element 32, the driving transistor 33, the selection transistor 35, the switch transistor 37, and the pixel capacitor 38 of the pixel circuit 30 according to the embodiment.

Here, the pixel circuit 130 does not include a switch transistor 34, and thus the light emission of the light emitting element 32 is performed by the switch transistor 37, rather than the light emission of the light emitting elements 32 being performed collectively by the light extinction signal EN.

At this time, when a control signal AZ is applied from the gate driving circuit 14 to the gate of the switch transistor 37, and the switch transistor 37 is turned on, the drain-to-source current of the driving transistor 33 flows through the switch transistor 37, but does not flow through the light emitting element 32. Accordingly, the light emitting element 32 extinguishes light. On the other hand, when the application of the control signal AZ to the gate of the switch transistor 37 is stopped, and the switch transistor 37 is turned off, the drain-to-source current of the driving transistor 33 flows through the light emitting element 32. Accordingly, the light emitting element 32 emits light.

Also, because the pixel circuit 130 does not include a switch transistor 36, the initialization operation is performed by the switch transistor 37.

Even with a display panel that includes the pixel circuit 130 configured described above, it is possible to suppress a flicker phenomenon as with the display device 1 according to the embodiment.

Variation 2

Figure 11:
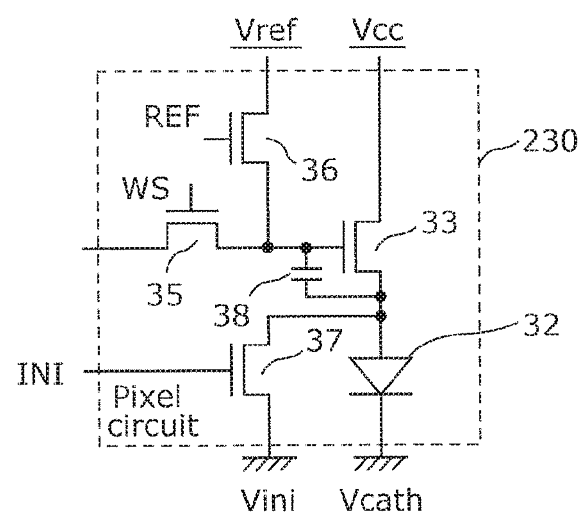
FIG. 11 is a circuit diagram showing a configuration of a pixel circuit according to Variation 2.

FIG. 11 is a circuit diagram showing a configuration of a pixel circuit 230 according to Variation 2. The pixel circuit 230 according to the present variation is different from the pixel circuit 30 according to the embodiment in that the pixel circuit 230 according to the present variation does not include a switch transistor 34.

As shown in FIG. 11, the pixel circuit 230 includes a light emitting element 32, a driving transistor 33, a selection transistor 35, switch transistors 36 and 37, and a pixel capacitor 38. The configurations of the light emitting element 32, the driving transistor 33, the selection transistor 35, the switch transistors 36 and 37, and the pixel capacitor 38 are the same as the configurations of the light emitting element 32, the driving transistor 33, the selection transistor 35, the switch transistors 36 and 37, and the pixel capacitor 38 of the pixel circuit 30 according to the embodiment.

Here, the pixel circuit 230 does not include a switch transistor 34, and thus the light emission of the light emitting element 32 is performed by the switch transistor 37, rather than the light emission of the light emitting elements 32 being performed collectively by the light extinction signal EN.

At this time, when a control signal INI is applied from the gate driving circuit 14 to the gate of the switch transistor 37, and the switch transistor 37 is turned on, the drain-to-source current of the driving transistor 33 flows through the switch transistor 37, but does not flow through the light emitting element 32. Accordingly, the light emitting element 32 extinguishes light. On the other hand, when the application of the control signal INI to the gate of the switch transistor 37 is stopped, and the switch transistor 37 is turned off, the drain-to-source current of the driving transistor 33 flows through the light emitting element 32. Accordingly, the light emitting element 32 emits light.

Even with a display panel that includes the pixel circuit 230 configured described above, it is possible to suppress a flicker phenomenon as with the display device 1 according to the embodiment.

OTHER EMBODIMENTS

The present disclosure is not limited to the configurations described in the embodiment and the variations given above, and it is possible to make modifications as appropriate.

For example, the gate driving circuit may be provided on one of the short sides of the panel unit, or may be provided on each of the opposing short sides of the panel unit. Likewise, the source driving circuit may be provided on one of the long sides of the panel unit, or may be provided on each of the opposing long sides of the panel unit.

Also, in the control device 20, the frame period may be started based on the supply of a vertical synchronization signal VS, or may be based on the input start timing of a video image period signal DE, or in other words, the timing at which the input of a video image period signal DE that is input after the vertical synchronization signal VS is started.

Also, as described above, the processing performed during the extended period may be ended at the timing at which a vertical synchronization signal VS is input, or the timing at which the input of a video image period signal DE is started.

Also, as described above, the data storing unit may be composed of line buffers, may be composed of other buffers, or may be a storage device, or the like.

Also, the light emitting elements are not limited to organic EL elements, and may be any other light emitting elements such as LEDs. The on-duty ratio of the light emitting elements is not limited to 90%, and may be changed as appropriate.

Also, as the control signal for controlling the light emitting elements to emit and extinguish light, a light extinction signal EN that contains a light extinction instruction may be used, or a light emission signal that contains a light emission instruction may be used according to the characteristics of the transistors.

Also, in the display device, the pixel circuit configuration is not limited to those shown in the embodiment and the variations given above, and may be changed. For example, as long as each pixel circuit is configured to include a driving transistor, a selection transistor, and a pixel capacitor, the arrangement of other switch transistors may be changed as appropriate. Also, a plurality of transistors provided in the pixel circuit may be polysilicon TFTs, or other transistors such as amorphous silicon TFTs. Also, the conductivity type of the transistors may be N channel type or P channel type, or may be a combination thereof.

Figure 12:
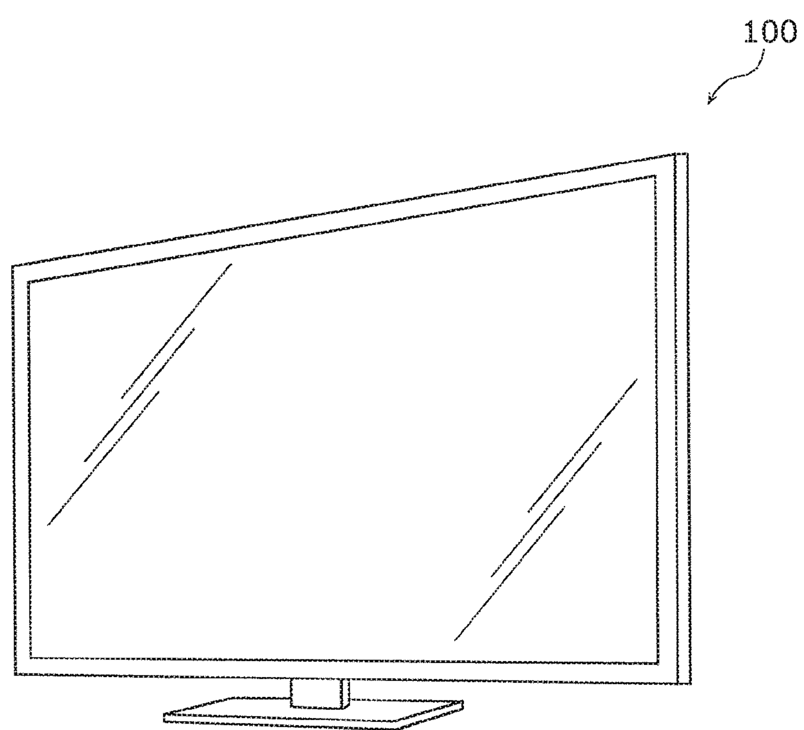
FIG. 12 is an external view of a thin flat television system that is an example of a display device in which the control device according to the embodiment is incorporated.

The present disclosure also encompasses other embodiments obtained by making various modifications that can be conceived by a person having ordinary skill in the art to the above-described embodiment as well as embodiments implemented by any combination of the structural elements and the functions of the above embodiment without departing from the scope of the present disclosure. For example, as examples of the display device that includes the control device according to the present disclosure, a thin flat television system 100 as shown in FIG. 12, a gaming console in which a display panel is incorporated, and a PC monitor system are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful in technical fields such as, in particular, television systems, and displays for gaming consoles and personal computers that are required to provide a display at a high resolution and at a high speed.

The invention claimed is:

1. A display panel control device that controls display of a display panel including a plurality of pixel circuits that are arranged in rows and columns, the display panel control device comprising:

a data storage that temporarily stores a video image signal received from outside;

a synchronization controller that supplies the video image signal from the data storage to the display panel based on a vertical synchronization signal received from the outside; and a duty controller that controls light emission and light extinction of the display panel, wherein the synchronization controller starts a frame period when the vertical synchronization signal is received, the frame period including a video image period and an extended period, the video image period being a period from after reception of the vertical synchronization signal by the synchronization controller to end of supply of the video image signal from the data storage to the display panel, and the extended period being a period from after end of the video image period to next reception of the vertical synchronization signal by the synchronization controller, the synchronization controller initializes the pixel circuits within a predetermined period after the reception of the vertical synchronization signal or detection of a start timing of a video image period signal, temporarily stores the video image signal in the data storing unit after the reception of the vertical synchronization signal or the detection of the start timing of the video image period signal, and causes the data storage to supply the video image signal from the data storage to the display panel after the initialization and during the video image period, and the duty controller causes the display panel to emit light after the initialization and during the video image period, and controls the display panel such that the display panel emits and extinguishes light at a predetermined duty ratio during the extended period.

2. The display panel control device according to claim 1, wherein the predetermined duty ratio is a ratio of a length of a light emission period of the display panel during the video image period to a length of the video image period.

3. The display panel control device according to claim 1, wherein the duty controller includes:

a sequencer device that outputs a sequence of light emission and light extinction of the display panel; and a light emission controller that controls the light emission and light extinction of the display panel based on the sequence output from the sequencer device.

4. The display panel control device according to claim 3, wherein the sequencer device includes:

a video image period counter that counts a length of the video image period;

a light extinction period counter that counts a length of a light extinction period in the video image period during which the display panel extinguishes light;

a light emission period counter that counts a length of a light emission period in the video image period during which the display panel emits light; and a sequence controller that generates the sequence of light emission and light extinction of the display panel based on count values of the video image period counter, the light extinction period counter, and the light emission period counter.

5. The display panel control device according to claim 3, wherein the light emission controller outputs a light extinction signal for causing the display panel to extinguish light.

6. A display device comprising:

a panel in which a plurality of pixel circuits that include light emitting elements are arranged in rows and columns;

a source driving circuit that supplies a video image signal to the pixel circuits, the video image signal being a signal that is displayed on the panel;

a gate driving circuit that supplies a synchronization signal to the pixel circuits, the synchronization signal being a signal for controlling a display timing of the video image signal that is displayed on the panel; and a control device that controls the gate driving circuit and the source driving circuit, the control device including a data storage that temporarily stores a video image signal received from outside;

a synchronization controller that supplies the video image signal from the data storage to the pixel circuits based on a vertical synchronization signal received from the outside; and a duty controller that controls light emission and light extinction of the light emitting elements, wherein the synchronization controller starts a frame period when the vertical synchronization signal is received, the frame period including a video image period and an extended period, the video image period being a period from after reception of the vertical synchronization signal by the synchronization controller to end of supply of the video image signal from the data storage to the pixel circuits, and the extended period being a period from after end of the video image period to next reception of the vertical synchronization signal by the synchronization controller, the synchronization controller initializes the pixel circuits within a predetermined period after the reception of the vertical synchronization signal or detection of a start timing of a video image period signal, temporarily stores the video image signal in the data storing unit after the reception of the vertical synchronization signal or the detection of the start timing of the video image period signal, and causes the data storage to supply the video image signal from the data storage to the pixel circuits after the initialization and during the video image period, and the duty controller causes the light emitting elements to emit light after the initialization and during the video image period, and controls the gate driving circuit such that the light emitting elements emit and extinguish light at a predetermined duty ratio during the extended period.

7. The display device according to claim 6, wherein the predetermined duty ratio is a ratio of a length of a light emission period of the light emitting elements during the video image period to a length of the video image period.

8. The display device according to claim 6, wherein the duty controller includes:

a sequencer device that outputs a sequence of light emission and light extinction of the light emitting elements; and a light emission controller that controls the light emission and light extinction of the light emitting elements based on the sequence output from the sequencer device.

9. The display device according to claim 8, wherein the sequencer device includes:

a video image period counter that counts a length of the video image period;

a light extinction period counter that counts a length of a light extinction period in the video image period during which the light emitting elements extinguish light;

a light emission period counter that counts a length of a light emission period in the video image period during which the light emitting elements emit light; and a sequence controller that generates the sequence of light emission and light extinction of the light emitting elements based on count values of the video image period counter, the light extinction period counter, and the light emission period counter.

10. The display device according to claim 8, wherein the light emission controller outputs a light extinction signal for causing the light emitting elements to extinguish light.

11. A method for driving a display panel that includes a plurality of pixel circuits that are arranged in rows and columns, the method comprising:

starting a frame period when a vertical synchronization signal is received, the frame period including a video image period and an extended period, the video image period being a period from after reception of the vertical synchronization signal to end of supply of a video image signal to the pixel circuits, and the extended period being a period from after end of the video image period to next reception of the vertical synchronization signal;

initializing the pixel circuits within a predetermined period after the reception of the vertical synchronization signal or detection of a start timing of a video image period signal;

after the reception of the vertical synchronization signal or the detection of the start timing of the video image period signal, temporarily storing the video image signal in a data storage;

after the initialization and during the video image period, supplying the video image signal from the data storage to the pixel circuits;

after the initialization and during the video image period, displaying the video image signal by causing a light emitting element provided in each of the plurality of pixel circuits to emit light; and during the extended period, performing light emission and light extinction of the light emitting elements at a predetermined duty ratio.

12. The method for driving a display panel according to claim 11, wherein the predetermined duty ratio is a ratio of a length of a light emission period of the light emitting elements during the video image period to a length of the video image period.

* * * * *